United States Patent [19]

Kawamoto et al.

[11] Patent Number: 5,293,223
[45] Date of Patent: Mar. 8, 1994

[54] TIME-DIVIDING METHOD AND CIRCUIT, AND TELEVISION WHITE BALANCE CONTROL UTILIZING SUCH CIRCUIT

[75] Inventors: Koji Kawamoto, Hitachi; Masanori Kamiya, Yokohama; Hideaki Ohki, Fujisawa; Shun Terada, Kamakura, all of Japan

[73] Assignees: Hitachi, Ltd; Hitachi Video & Information Systems, Inc, both of Japan

[21] Appl. No.: 760,153

[22] Filed: Sep. 16, 1991

[30] Foreign Application Priority Data

Sep. 17, 1990 [JP] Japan .................................. 2-243735

[51] Int. Cl.$^5$ .......................... H04N 9/73; H03K 5/22
[52] U.S. Cl. ..................................... 348/655; 307/603
[58] Field of Search ............................. 358/29, 64, 65; 307/350, 353, 358, 590, 600, 603, 607, 151; H04N 9/73

[56] References Cited

U.S. PATENT DOCUMENTS 3,497,817  2/1970  Ellis ................................. 307/350 X
4,277,697  7/1981  Hall et al. ......................... 307/358 X
4,340,904  7/1982  Wingrove, Jr. ....................... 358/29
4,520,283  5/1985  Sasaki et al. ..................... 328/151 X
4,748,497  5/1988  Sengoku .............................. 358/29
4,930,004  5/1990  Yamamoto et al. .................... 358/29
5,015,892  5/1991  Parsi et al. ....................... 307/600
5,036,387  7/1991  Umezawa ............................. 358/29

Primary Examiner—Victor R. Kostak
Attorney, Agent, or Firm—Antonelli, Terry, Stout & Kraus

[57] ABSTRACT

A time-dividing circuit including a first capacitor, a second capacitor, a current source for charging the first capacitor, circuitry for distributing the charge of the first capacitor to the second capacitor in a predetermined ratio, a compare for comparing the voltages on the first and second capacitors and producing a comparison output signal, circuitry for discharging the charges on the first and second capacitors, and a control circuit for producing control signals for controlling the time-dividing circuit. The time-dividing circuit can be utilized in an automatic white balance control circuit for a color television receiver.

13 Claims, 6 Drawing Sheets

TIME-DIVIDING METHOD AND CIRCUIT, AND TELEVISION WHITE BALANCE CONTROL UTILIZING SUCH CIRCUIT

BACKGROUND OF THE INVENTION

This invention relates to time-dividing circuits for dividing the period of an input signal having a periodicity, and particularly to a time-dividing method and circuit suitable for use in extracting only a particular time-divided timing in the automatic white balance control circuit of color television.

When it is desired to divide the period of an input signal in synchronism with the period, a PLL (phase locked loop) using a VCO (voltage controlled oscillator) is generally used. The conventional technique for the PLL circuit of this kind is described in, for example, "Bipolar Integrated Circuit", pp 218-229, published by Kindaikagakusha in Japan (1984).

This PLL circuit can be used to produce an output having the period of the input signal divided by N, but generally it is a large circuit scale. Also, if only a particular time-divided timing is necessary, a counter circuit must be added.

Other conventional technical papers showing the background of the invention are as follows:

"Basics and Applications of PLL" pp 60-97;
HITACHI, AKB IC pp 1-19; and
ECN 2511 Application Guide pp 1-12.

The above prior art is widely used and excellent, but has the problem that the circuit scale is too large to be economical when a particular time-divided timing is necessary.

SUMMARY OF THE INVENTION

Accordingly, it is an object of the invention to provide a time-dividing method and circuit solving the above problem and capable of producing timing corresponding to a constant proportion of the period of the input signal while utilizing a very simple circuit arrangement.

It is another object of the invention to provide a time-dividing method and circuit capable of reducing the number of parts of the circuit to reduce the size of the circuit arrangement, producing an arbitrary time-divided timing, changing the time-divided timing during circuit operation, preventing the time-divided timing from being changed by temperature, minimizing the effect of the dispersion of the characteristics, or irregular characteristics, of circuit components, caused during the manufacturing process, and highly stabilizing the time-divided timing.

According to this invention, the above objects can be achieved by providing conversion means for converting the lapse time into an accumulatable amount, two accumulators, distributing means for the accumulation amount, discharging means for the accumulation amount, and comparing means for accumulation amount. Thus, the circuit arrangement can be extremely simplified as compared with the prior art.

Also, the objects of the invention can be achieved by providing, in addition to the above-given means, means for changing the distribution ratio of the accumulation amount to enable the time-divided timing to be changed during circuit operation, and a plurality of elements of a first or second accumulator so as to change the distribution ratio of the accumulation amount.

Moreover, the objects of the invention can be achieved by providing a control circuit for stably operating the circuits of the above means in correct order, by employing a capacitor for the accumulator, a MOS switch as the accumulation amount distribution means so as to improve the stability of the time-divided timing, and an FET-input comparator as the comparator, and by forming all the above means as a semiconductor integrated circuit in order to significantly improve the stability of the time-divided timing.

According to this invention, as described above, since the circuit arrangement can be extremely simplified, the number of parts to be used is small, with the result that it is possible to provide a small, highly reliable, and low-cost time-dividing circuit.

In addition, since means for changing the distribution ratio of the accumulation amount is provided, the time-divided timing can be changed during circuit operation, and thus this time-dividing circuit can be applied to various different systems.

Moreover, since this invention includes a control circuit for the time dividing, the application circuits to which this invention is applied can be immediately implemented.

By employing a capacitor for the accumulator, it is possible to provide this invention as electrical circuits. In this case, the accumulation amount is of electrical charges. When the charge is represented by Q, the capacitance value of the capacitor by C, and the voltage by V, the following relationship can be established:

$$Q = CV$$

Therefore, in the electric circuits for implementing this invention, it is desirable that a comparator circuit compare voltages by using the above relationship without direct comparison of charges Q. This is why the comparator circuit for voltage comparison can be provided easily.

This invention employs a MOS switch for the distribution means. Since the MOS switch has a very high gate input impedance, the accumulated charges do not escape from the gate, and thus the circuit can be very precisely and stably operated. Also, the FET-input comparator is employed as the comparator for the same reason.

A description will be described of the semiconductor integrated circuit version of this invention.

The semiconductor integrated circuit can easily offer extremely highly precision capacitors. Therefore, when this invention is implemented as a semiconductor integrated circuit, it is possible to provide a time-dividing circuit with characteristics less dispersed during the manufacturing process. Here, it should be noted that when capacitors are used for the accumulators in this invention, the factor for deciding the proportions for time-dividing the period of the input signal is only the capacitance ratio of the capacitors.

Moreover, the semiconductor integrated circuit, as well known, has high stability and reliability indeed.

DESCRIPTION OF THE PREFERRED EMBODIMENTS

Embodiments of a time-dividing circuit of the invention will be described with reference to the accompanying drawings.

Figure 1:
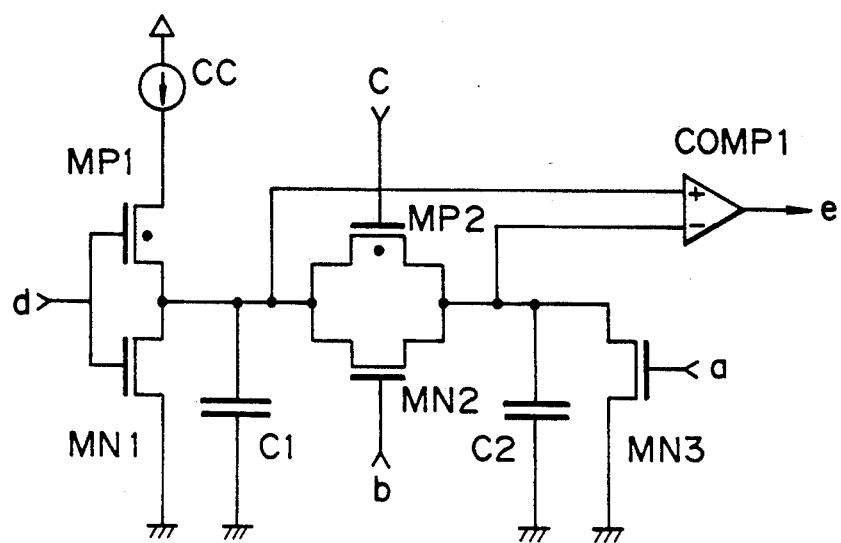
FIG. 1 is a circuit diagram of a main part of the time-dividing circuit in one embodiment of the invention.
Figure 2:
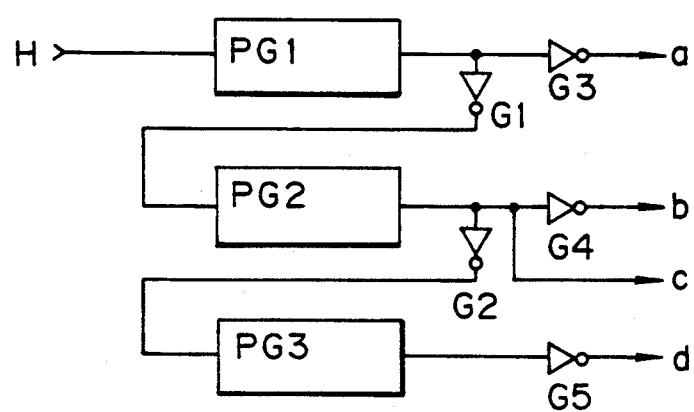
FIG. 2 shows a control circuit for generating control signals for driving the time-dividing circuit illustrated in FIG. 1.
Figure 3:
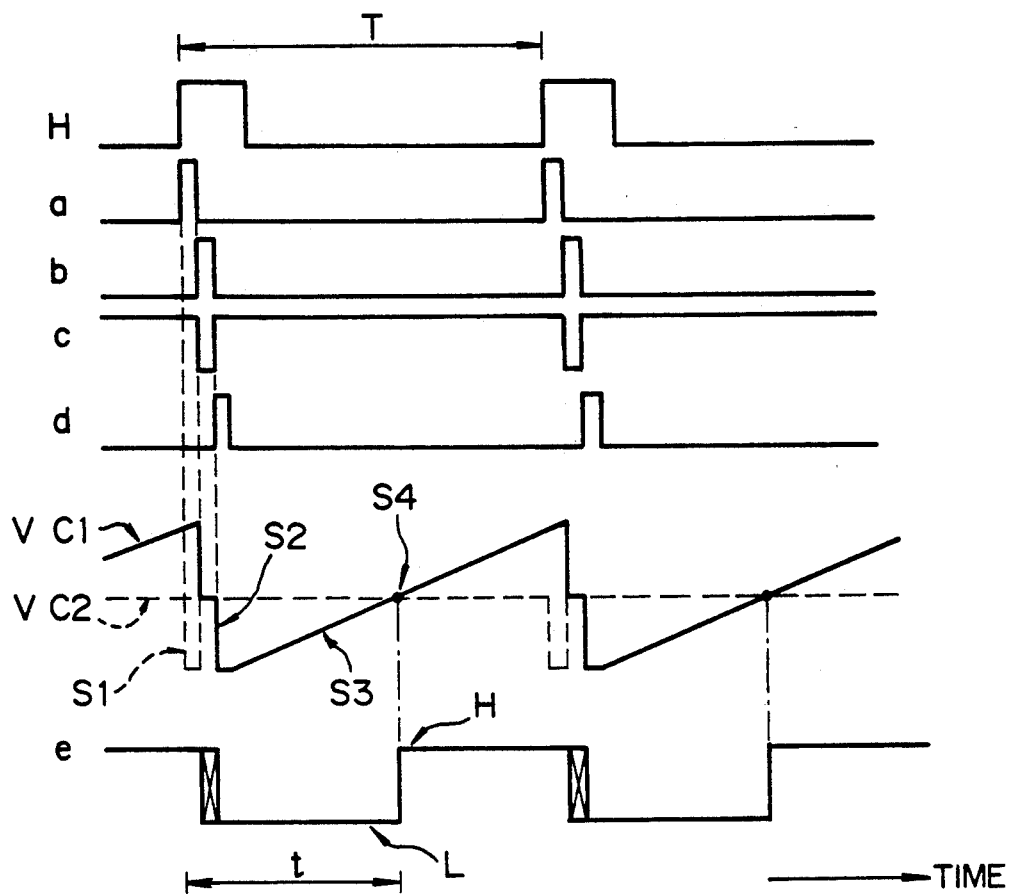
FIG. 3 is a waveform diagram useful for explaining the circuit operation in FIGS. 1 and 2.
Figure 4:
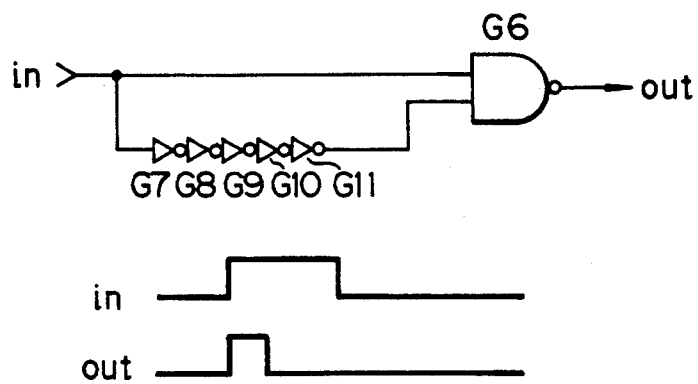
FIG. 4 is a circuit- and waveform-diagram of an example of the one-shot multivibrator circuit used in the embodiment of the invention.

FIG. 1 is a circuit diagram of a main circuit arrangement of one embodiment of the invention, FIG. 2 is a block diagram of the construction of the control circuit, FIG. 3 is a waveform diagram useful for explaining the operation of the embodiment, and FIG. 4 is a diagram of an example of the one-shot multivibrator circuit. In FIGS. 1 and 2, MP1 and MP2 represent P-type MOS switches, MN1 to MN3 represent N-type MOS switches, C1 and C2 represent capacitors, COMP1 represents a comparator, and PG1 to PG3 represent one-shot multivibrator circuits.

In the main circuit arrangement of the time-dividing circuit as one embodiment of the invention shown in FIG. 1, the capacitors C1 and C2 correspond to first and second accumulators, and the N type MOS switches MN1 and MN3 are means for discharging the charges accumulated in the accumulators, or the capacitors C1 and C2.

The P type MOS switch MP2 and N type MOS switch MN2 are used as means for distributing the accumulated amounts. The comparator COMP1 is used to compare the voltages across the capacitors C1 and C2, or as a FET-input comparator.

The constant current source, CC and the P type MOS switch MP1 together function as means for converting the lapsed time into an accumulatable amount.

The circuit arrangement shown in FIG. 1 is the electrical circuit version of the invention, and the accumulatable amount given above and which will be given hereinafter, indicates the charge Q. Shown at a, b, c, and d are terminals for receiving the control signals from the control circuit, and at e is a signal output terminal.

In FIG. 2, an example of the control circuit is shown for supplying the control signals to the terminals a to d so as to drive the time-dividing main circuit shown in FIG. 1.

This control circuit is formed of one-shot multivibrator circuits PG1, PG2 and PG3, inverters G1 and G2 having delays and inverters G3, G4 and G5 as illustrated. The terminals a, b, c and d shown in FIG. 2 are output terminals for the control signals and are connected to the terminals represented by the same reference numerals in FIG. 1. Also, to the terminal H of FIG. 2 is supplied a periodical input signal such, for example, a synchronizing signal in a television receiver, to be time-divided.

The one-shot multivibrator circuit PG1, PG2, PG3 is formed of, as shown for example in FIG. 4, inverters G7 to G11 for determining the output pulse width, and an AND gate G6.

FIG. 3 shows the input and output waveforms at the terminals and the voltage waveforms VC1, VC2 across the capacitors C1, C2 which are produced when the time-dividing main circuit of FIG. 1 and the control circuit of FIG. 2 are combined and operated.

The time-dividing circuit operation of the combination of the time-dividing main circuit and the control circuit will be described with reference to the waveform diagram of FIG. 3.

(1) When an input signal having a repetitive period such as shown by signal H in FIG. 3 is applied to the terminal H of the control circuit, the control circuit produces at its output terminals a to d in turn pulse signals which do not overlap, as indicated in FIG. 3 at a to d. However, the pulse signals at the output terminals b, c are produced at the same time but have a phase difference of 180 degrees. These pulse signals a to d have a duration short enough to be negligible as compared with the period T of the input signal H.

(2) When the control signal is supplied to the output terminal a, the MOS switch MN3 is turned on so that the charge accumulated on the capacitor C2 during the previous period of the input signal is discharged through the MOS switch MN3 (S1 in FIG. 3).

(3) Then, when the control signals are supplied from the output terminals b and c, the MOS switches MN2 and MP2 are turned on so that the charge accumulated on the capacitor C1 during the previous period of the input signal is partially discharged to charge the capacitor C2 through these switches; i.e., that charge is distributed to the capacitor C2 (S2 in FIG. 3). At this time, the voltage across the capacitor C1 is equal to that across the capacitor C2, or the charge is distributed between the capacitors C1 and C2 in such a proportion as to correspond to the ratio of the capacitance values of the capacitors C1 and C2, thus providing corresponding voltage values to the capacitors C1 and C2.

(4) When the control signal is supplied from the output terminal d, the MOS switch MN1 is turned on so that the remaining charge left on the capacitor C1 after the charge accumulated on the capacitor C1 during the previous period of the input signal was partially distributed to the capacitor C2 as described above, is discharged through the MOS switch MN1 which has just turned on by the signal at the terminal d.

(5) When the control signal at the terminal d has terminated the current from the constant current source CC flows through the MOS switch MP1 into the the capacitor C1, so that charge starts to accumulate on the capacitor C1 and increases the voltage across the capacitor C1 in proportion to the amount of accumulated charge (S3 in FIG. 3).

(6) The instant that the voltage across the capacitor C1 exceeds the voltage across the capacitor C2 (S4 in FIG. 3), the output e of the comparator COMP1 turns from L to H in its level, thus producing a timing signal as the result of the time division. In other words, the period T of the input signal is reduced by t (t<T).

(7) This embodiment of the invention, comprised of the circuits shown in FIGS. 1 and 2, repeats the above operation in accordance with the period of the periodical input signal fed to the terminal H.

The timing of the signal output from the comparator COMP1 will be described below.

If the period of the input signal is represented by T, and the time from the leading edge of the input signal to the leading edge of the output signal from the comparator is denoted by t, the following relation is satisfied:

$$t = T \times C1/(C1+C2)$$

where the combined period of the control signals a, b, c and d is neglected, since that is much smaller than the period T.

From the above expression, it will be understood that the embodiment of the invention is able to produce the time-divided signal at constant intervals of time, determined only by the capacitance value ratio of the capacitors relative to the period T of the input signal. In addition, from the above equation it will be seen that the circuit arrangement of the embodiment is not affected by the dispersion of the characteristics of the constant current source CC or temperature.

In the above embodiment of the invention, since the dividing ratio can be changed by changing the capacitance values of the capacitors, one or both of the capacitors C1 and C2 may be formed as a variable capacitance type capacitor or a plurality of capacitors which are switched.

Figure 5:
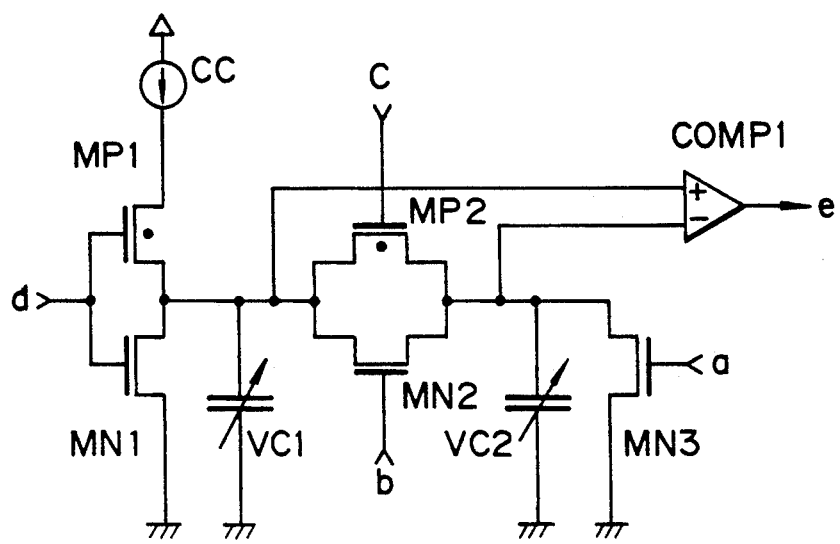
FIG. 5 is a circuit diagram of a circuit corresponding to that shown in FIG. 1 and employing variable capacitance type capacitors.
Figure 6:
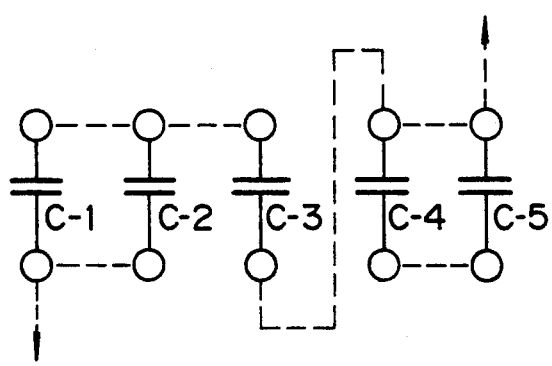
FIG. 6 is a circuit diagram of a plurality of fixed-capacitance capacitors adapted to be switched to provide the variable capacitance.

In other words, the capacitors C1 and C2 can be formed of variable capacitors VC1 and VC2 as shown in FIG. 5. In addition, as shown in FIG. 6, a plurality of capacitors C-1, C-2,...C-5 can be provided so that their terminals are switched; or for example, the capacitors, C-1 and C-2 are connected in parallel, the capacitors C-4 and C-5 in parallel and the capacitor C-3 in series with those parallel circuits.

Figure 7:
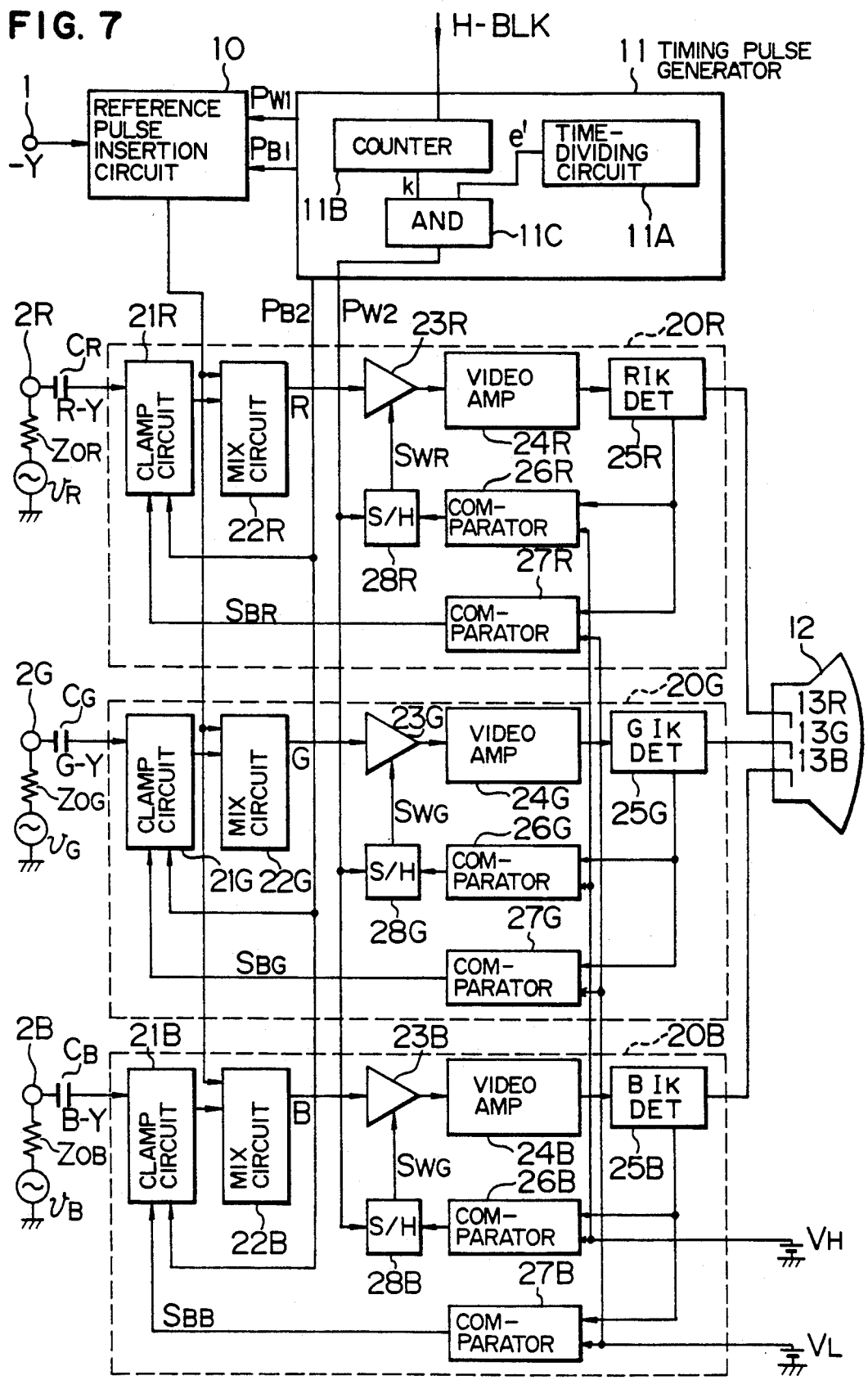
FIG. 7 is a circuit diagram showing an application of the time-dividing circuit of the invention in the automatic white balance control circuit of the color television.

With reference to FIG. 7, a description will be made of the application of the time dividing circuit described with reference to FIGS. 1 to 4 to the automatic white balance control circuit which automatically controls the white balance by detecting the cathode currents of R, G, B of a color television and adjusting the gains of the video amplifiers.

FIG. 7 is a schematic block diagram of the automatic white balance control circuit.

A $-Y$ signal is supplied via a terminal 1 to a reference pulse insertion circuit 10. In this circuit 10, during the vertical blanking interval, or immediately after the end of the vertical blanking interval, a reference white level signal is inserted in the input signal at a white timing pulse Pw, fed from a timing generation circuit 11, and a reference black level signal is inserted in the input signal at a black timing pulse $P_{B1}$ from circuit 11. A color difference signal $R-Y$ at a terminal 2R is fed through a coupling capacitor $C_R$ to a clamp circuit 21R where the DC level is controlled. The clamp circuit 21R receives as a clamp level input a black timing pulse $P_{B2}$, equal to or narrower than the black timing pulse $P_{B1}$, and is changed in clamp level by a control signal $S_{BR}$ which will be described later. The output signal from the clamp circuit 21R is supplied to a MIX circuit 22R where it is added to the $-Y$ signal with the above reference pulses inserted, to produce the primary signal R. The primary signal R is fed to a gain control circuit 23R of which the gain is changed by a control signal $S_{WR}$ which will be described later. Thus, the gain-controlled primary signal R is supplied to a video amplifier 24R. The output from the video amplifier 24R is fed through a cathode current detection circuit 25R to a cathode 13R of a Braun tube (CRT) 12. The current through the cathode 13R is detected by the cathode current detection circuit 25R. The detected output is supplied to comparators 26R and 27R. The comparator 26R compares the detected white-level output with a predetermined white level signal $V_H$, and produces a difference signal. This difference signal is then held in a sample-and-hold circuit 28R which receives a white timing pulse $P_{W2}$, equal to or narrower than the white timing pulse $P_{W1}$. The held difference signal is used as the above-mentioned control signal $S_{WR}$ to control the gain of the gain control circuit 23R, thus controlling the white level. The detected black level is compared with a predetermined black level signal $V_L$ in the comparator 27R. The difference signal therefrom is used as the above-mentioned control signal $S_{BR}$ to control the clamp level of the clamp circuit 21R, and thus to change the DC level of the color difference signal $R-Y$, controlling the black level.

The G- and B-channel can be controlled in the same way as the R-channel, so that color control can be obtained stably without adjustment.

In this automatic white balance control circuit, the white level control (or black level control) is as follows.

When the black level detected value from the cathode current detection circuit is not less than the predetermined black level as found by the comparison, the coupling capacitor at the clamp circuit input stage is charged to thereby increase the DC level of the color difference signal. When the black level detected value is larger than the predetermined black level, the coupling capacitor at the clamp circuit input stage is discharged to thereby decrease the DC level of the color difference signal. When the black level detected value is equal to the predetermined value and during other periods than the black level detecting interval, the coupling capacitor is not charged and discharged, but the DC level of the color difference signal is held in the coupling capacitor. Thus, the DC level at the cathode of the Braun tube (CRT) is changed by changing the DC level. The above operation is made for each channel of R, G and B separately, thereby controlling the black level. Therefore, black level control can be achieved even without special terminals for holding the DC level.

Figure 8:
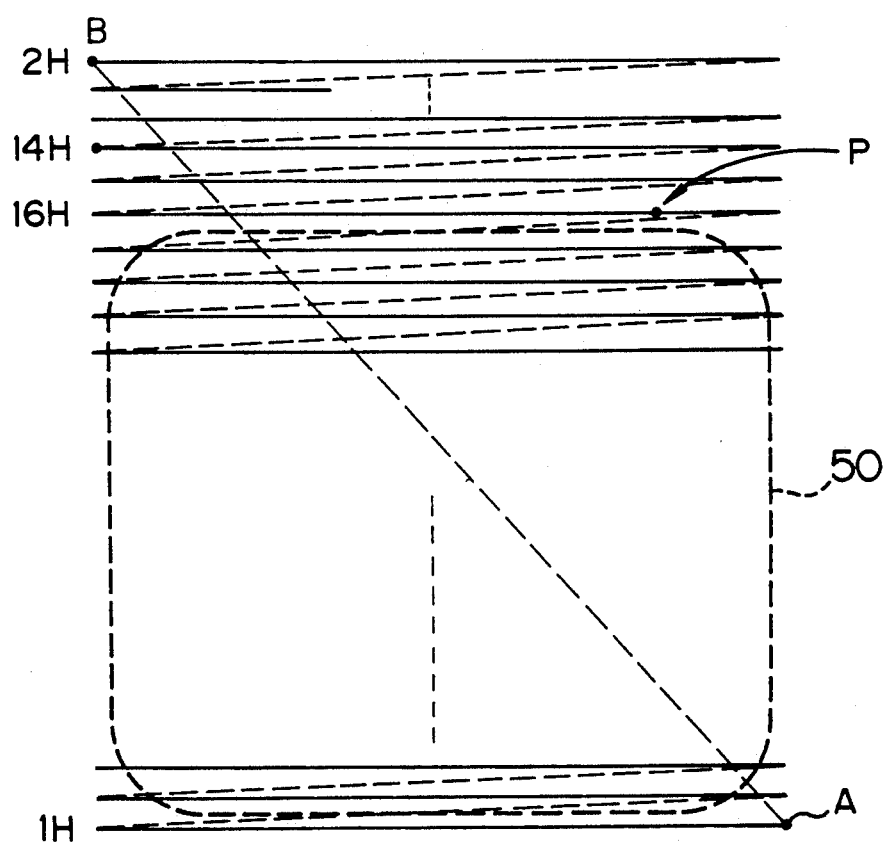
FIG. 8 is a front view showing the relation between the color television Braun tube and the scanning lines in the embodiment of FIG. 7.

In the automatic white balance control circuit mentioned above, it is desired that the cathode currents at cathodes R, G, B be detected for the white level control with such timing as at, for example, a certain time point P on a horizontal scan line out of the viewing contour 50 of the tube screen, or in the nonviewing region of the screen, as shown in FIG. 8. In other words, since horizontal scan lines are not stable for a while after the scanning beams finish the horizontal scanning of one field and return in the vertical direction from a point A out of the viewing contour to a point B, it is desired that the cathode currents be detected on a scan line of, for example, 16 H where this unstable condition disappears. In addition, the timing of point P on the scan line 16 H is more preferable. That is, referring to the signal waveform diagram of FIG. 9, it is desirable to detect the cathode currents at a time t' (corresponding to the time-divided point t in FIG. 3) to which a constant period T' (corresponding to the constant period T in FIG. 3) is divided. As described with reference to FIGS. 3, 5 and 6, the time point t' to which the constant period T' is divided can be obtained by proper selection of the capacitance ratio of the capacitors C1 and C2. The time dividing circuit 11A of the timing pulse generation circuit 11 in FIG. 7 is equivalent to the circuit shown in FIGS. 1 and 2 and produces a signal e' for the generation of the time divided signal t' from the constant period T'. The counter 11B of the timing pulse generation circuit 11 selects only the line 16 H, as shown in FIG. 9.

Figure 9:
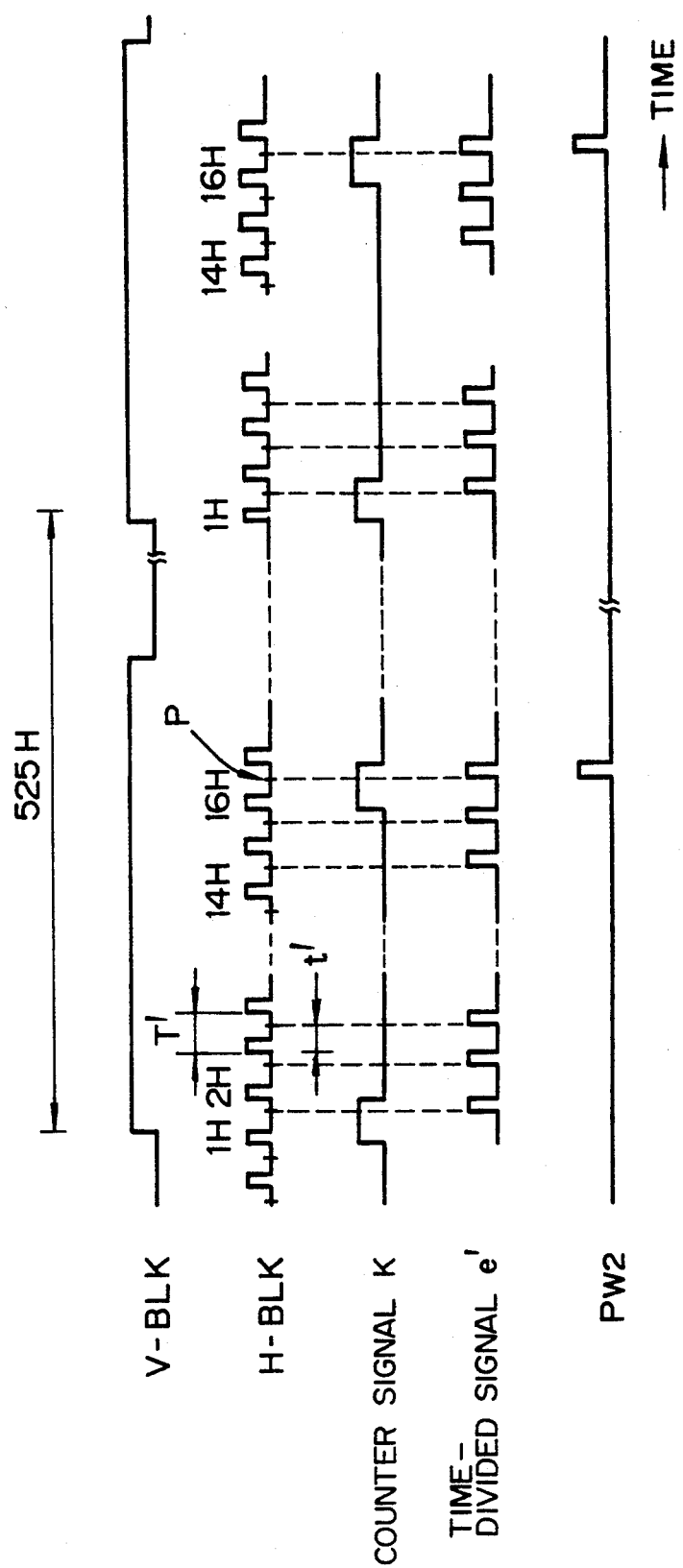
FIG. 9 is a signal waveform diagram useful for explaining the circuit operation of the embodiment shown in FIG. 7.

The signal K from the counter and the time divided signal e' are processed for the logical product (AND) to produce the desired timing P as shown in FIG. 9. In order to detect the cathode currents at this timing point P, the signal $P_{H2}$ from the AND gate 11C is supplied to the sample-and-hold circuit 28R. While the above operation is made for the R-channel of the color television, the same control operation can be made for the G-channel and B-channel. Thus, on each channel, the cathode current can be detected at an appropriate timing point P, and thus the white level can be automatically adjusted.

The time-dividing circuit mentioned above can be entirely formed of a semiconductor integrated circuit, and thus capacitors of very high ratio precision can be provided. Therefore, the time-dividing circuit has almost no manufacturing variation high stability, high reliability and very small size and is produced at low cost.

According to this invention, as described above, the time-dividing circuit has a very simple circuit construction, and a small number of parts is used, and thus it is of a small size, high reliability and low cost.

Moreover, according to this invention, since the time-divided timing can be changed during the circuit operation, application to various different systems is possible.

Also, since this invention includes the control circuit for the time-dividing circuit, the applied circuits can be swiftly implemented.

In addition, since in this invention, capacitors can be used as accumulators so that the output timing of the time-divided signal can be determined by only the capacitance ratio of the capacitors, the time-dividing circuit has less manufacturing variation, and is not affected by the temperature change, and so is extremely stable.

Moreover, since this invention employs a MOS switch as the distribution means, the accumulated charges do not escape from the gate input, and thus the time-dividing circuit is highly precise and stable.

For the same reason, this invention employs an FET-input comparator, and thus it is further highly precise and stable.

Furthermore, since the time-dividing circuit of the invention can be entirely formed as a semiconductor integrated circuit, extremely precise ratio capacitors can be easily provided, resulting in even less manufacturing variation, high stability, high reliability, small size and low cost in the time-dividing circuit.

We claim:

1. A time-dividing method utilizing circuitry including first and second capacitors, said method comprising the steps of:
   receiving a periodic input signal;
   discharging said second capacitor in synchronism with the period of the input signal;
   distributing a part of the charge on said first capacitor onto said second capacitor;
   discharging the charge remaining on said first capacitor after said distribution;
   re-charging said first capacitor;
   comparing the voltages on said first and second capacitors; and
   generating a time-dividing output signal when the voltage on said first capacitor exceeds the voltage on said second capacitor.

2. A time-dividing circuit comprising;
   a first capacitor;
   a second capacitor;
   means for charging said first capacitor;
   means for distributing the charge on said first capacitor onto said second capacitor with a predetermined ratio;
   comparing means for comparing the voltages on said first and second capacitors;
   means for discharging the charges on said first and second capacitors;
   means for preventing the overlap of any of (i) a period during which the charge on said second capacitor is discharged, (ii) a period during which the charge on said first capacitor is distributed onto said second capacitor, (iii) a period during which the charge remaining on said first capacitor is discharged, and (iv) a period during which another charge is accumulated on said first capacitor; and
   control means for producing control signals for controlling said respective means.

3. A time-dividing circuit according to claim 2, further comprising means for changing the distribution ratio at which the charge on said first capacitor is distributed onto said second capacitor.

4. A time-dividing circuit according to claim 3, wherein said distribution ratio changing means comprises a variable-capacitance capacitor.

5. A time-dividing circuit according to claim 3, wherein said distribution ratio changing means comprises a plurality of capacitors and switching means switchably connecting said plurality of capacitors.

6. A time-dividing circuit according to claim 2, wherein said distributing means includes a MOS switch.

7. A time-dividing circuit for dividing the period of an input signal comprising:
   a first power supply terminal;
   a second power supply terminal;
   an output terminal;
   a first switch;
   a first capacitor having one end connected through said first switch to said first power supply terminal and the other end connected to said second power supply terminal;
   a second switch connected between said one end of said first capacitor and said second power supply terminal;
   a third switch;
   a second capacitor having one end connected through said third switch to said one end of said first capacitor and the other end connected to said second power supply terminal;
   a fourth switch connected between said one end of said second capacitor and said second power supply terminal;
   a comparator for comparing the voltages on said first and second capacitors;
   means for turning on said fourth switch at a first time point for a first time interval long enough to discharge the charge on said second capacitor;
   means for turning on said third switch at a second time point not earlier than the end of said first time interval and for a second time interval long enough to transfer charge from said first capacitor onto said second capacitor;

means for turning on said second switch at a third time point not earlier than the end of said second time interval and for a third time interval long enough to discharge charge remaining on said first capacitor; and means for turning on said first switch during a time interval in which said second switch is turned off.

8. A time-dividing circuit according to claim 7, further comprising means for changing the amount of charge transferred from said first capacitor onto said second capacitor.

9. A time-dividing circuit according to claim 8, wherein said changing means comprises a variable-capacitance capacitor.

10. A time-dividing circuit according to claim 8, wherein said changing means comprises a plurality of capacitors and switching means switchably connecting said plurality of capacitors.

11. A time-dividing circuit according to claim 7, wherein said third switch comprises a MOS switch.

12. An automatic white balance control circuit for a color television receiver comprising:
- means for detecting cathode currents of a color television cathode ray tube;
- reference signal generating means for generating reference signals;
- comparing means for comparing the outputs of said cathode current detecting means and the reference signals from said reference signal generating means;
- control means for controlling said cathode currents;
- a first capacitor;
- a second capacitor;
- means for charging said first capacitor;
- means for distributing the charge on said first capacitor onto said second capacitor with a predetermined ratio;
- comparing means for comparing the voltages on said first and second capacitors;
- means for discharging the charges on said first and second capacitors; and
- control means for producing control signals for controlling said respective means.

13. An automatic white balance control circuit for a color television receiver, comprising:
- means for detecting cathode currents of a color television cathode ray tube;
- reference signal generating means for generating reference signals;
- comparing means for comparing the outputs of said cathode current detecting means and the reference signals from said reference signal generating means;
- control means for controlling said cathode currents;
- a first power supply terminal;
- a second power supply terminal;
- an output terminal;
- a first switch;
- a first capacitor having one end connected through said first switch to said first power supply terminal and the other end connected to said second power supply terminal;
- a second switch connected between said one end of said first capacitor and said second power supply terminal;
- a third switch;
- a second capacitor having one end connected through said third switch to said one end of said first capacitor and the other end connected to said second power supply terminal;
- a fourth switch connected between said one end of said second capacitor and said second power supply terminal;
- a comparator for comparing the voltages on said first and second capacitors;
- means for turning on said fourth switch at a first time point for a first time interval long enough to discharge the charge on said second capacitor;
- means for turning on said third switch at a second time point not earlier than the end of said first time interval and for a second time interval long enough to transfer charge from said first capacitor onto said second capacitor;
- means for turning on said second switch at a third time point not earlier than the end of said second time interval and for a third time interval long enough to discharge charge remaining on said first capacitor; and
- means for turning on said first switch during a time interval in which said second switch is turned off.

* * * * *